(12) United States Patent
Alakuijala et al.

(10) Patent No.: US 9,450,607 B1
(45) Date of Patent: Sep. 20, 2016

(54) ENCODING OR DECODING CHARACTERS AS WORD IN CORPUS

(71) Applicant: GOOGLE INC., Mountain View, CA (US)

(72) Inventors: Jyrki Antero Alakuijala, Adliswil (CH); Zoltan Szabadka, Adliswil (CH)

(73) Assignee: Google Inc., Mountain View, CA (US)

( * ) Notice: Subject to any disclaimer, the term of this patent is extended or adjusted under 35 U.S.C. 154(b) by 236 days.

(21) Appl. No.: 14/328,010

(22) Filed: Jul. 10, 2014

(51) Int. Cl.
*H03M 7/30* (2006.01)
*G06F 17/22* (2006.01)
*G06F 17/27* (2006.01)

(52) U.S. Cl.
CPC ........ *H03M 7/3086* (2013.01); *G06F 17/2217* (2013.01); *G06F 17/2276* (2013.01); *G06F 17/2735* (2013.01); *H03M 7/3088* (2013.01)

(58) Field of Classification Search
None
See application file for complete search history.

(56) References Cited

U.S. PATENT DOCUMENTS

| | | | | |
|---|---|---|---|---|
| 5,951,623 | A * | 9/1999 | Reynar | H03M 7/3086 341/106 |
| 7,026,962 | B1 * | 4/2006 | Emami | H03M 7/3088 341/106 |
| 8,044,829 | B2 * | 10/2011 | Chen | H03M 7/3086 341/51 |

OTHER PUBLICATIONS

"LZ77 and LZ78", from Wikipedia, the free encyclopedia, May 21, 2014, 4 pages.

* cited by examiner

*Primary Examiner* — Howard Williams
(74) *Attorney, Agent, or Firm* — Brake Hughes Bellermann LLP

(57) ABSTRACT

Data may be decompressed by receiving a compressed sequence of characters, the compressed sequence of characters being represented by at least a first received number, dividing the first received number by a number of words in a corpus of words to determine a quotient and a remainder, retrieving a word from the corpus of words based on the remainder, retrieving a transformation from a transformation index based on the quotient, and performing the retrieved transformation on the retrieved word. The representations of characters included in the transformed word may be a decompressed version of the received compressed sequence of characters.

25 Claims, 10 Drawing Sheets

ENCODING OR DECODING CHARACTERS AS WORD IN CORPUS

TECHNICAL FIELD

This description relates to compressing and decompressing data.

BACKGROUND

Data may be compressed according to algorithms known to both sender and receiver. Compression may reduce the number of bits or other representations required to transmit the data.

SUMMARY

According to an example embodiment, a non-transitory computer-readable storage medium may comprise instructions stored thereon. When executed by at least one processor, the instructions may be configured to cause a computing system to decompress data by receiving, via an electronic transmission medium, a compressed sequence of characters, the compressed sequence of characters being represented by at least a first received number, dividing the first received number by a number of words in a corpus of words to determine a quotient and a remainder, retrieving a word from the corpus of words based on the remainder, the corpus of words being stored on at least one memory device, retrieving a transformation from a transformation index based on the quotient, the transformation index being stored on the at least one memory device, performing the retrieved transformation on the retrieved word, and sending representations of characters included the transformed word to a computing device, the representations of characters included in the transformed word being a decompressed version of the received compressed sequence of characters.

According to another example embodiment, a non-transitory computer-readable storage medium may comprise instructions stored thereon. When executed by at least one processor, the instructions may be configured to cause a computing system to decompress data by receiving, via an electronic transmission medium, a compressed sequence of characters, the compressed sequence of characters being represented by at least a distance value and a length value, determining whether the distance value exceeds a window size of a window of previously decoded characters, the window of previously decoded characters being stored on at least one memory device. If the distance value does not exceed the window size, the instructions may be configured to cause the computing system to repeat a sequence of previously decoded characters from the window of previously decoded characters with a length based on the length value at a position in the window of previously decoded characters based on the distance value. If the distance value does exceed the window size, the instructions may be configured to cause the computing system to retrieve a word from a corpus of words, the corpus of words being stored on the at least one memory device. The instructions may be further configured to cause the computing system to send representations of characters included in the retrieved word to a computing device, the representations of characters included in the retrieved word being a decompressed version of the received compressed sequence of characters.

According to another example embodiment, a non-transitory computer-readable storage medium may comprise instructions stored thereon. When executed by at least one processor, the instructions may be configured to cause a computing system to compress data by determining whether a sequence of characters matches a word included in a corpus of words or matches a transformed version of the word, the corpus of words being stored in at least one memory device and the transformation performed on the word being stored in the at least one memory device. If the sequence if characters does not match the word included in the corpus of words and is not one transformation away from the word, the instructions may be configured to cause the computing system to encode the sequence of characters as a sequence of codewords. If the sequence of characters matches the word included in the corpus of words, the instructions may be configured to cause the computing system to encode the sequence of characters with a reference to the word. If the sequence of characters matches the transformed version of the word, the instructions may be configured to cause the computing system to encode the sequence of characters with a reference to the word and a reference to the transformation.

The details of one or more implementations are set forth in the accompanying drawings and the description below. Other features will be apparent from the description and drawings, and from the claims.

DETAILED DESCRIPTION

Figure 1:
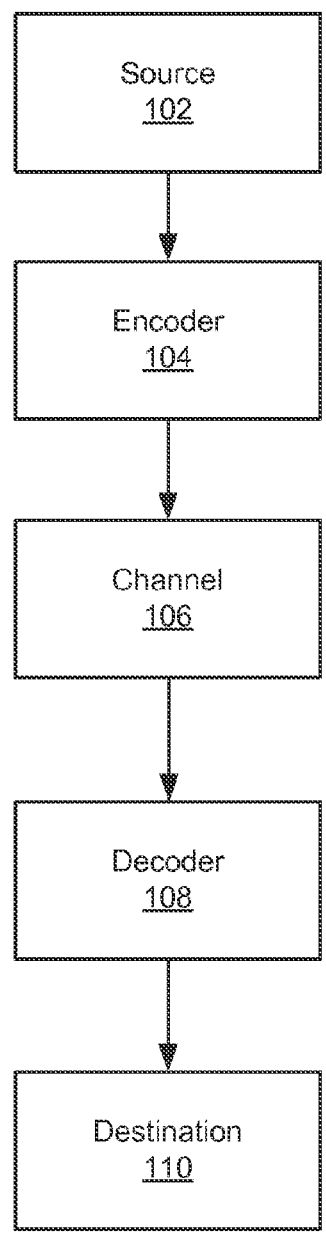
FIG. 1 is a diagram of a communication system according to an example implementation.

FIG. 1 is a diagram of a communication system 100 according to an example implementation. The communication system 100 may transmit information and/or data from a source 102 to a destination 110. The information and/or data may represent characters, such as letters, numbers, punctuations marks, and/or symbols, in any language, such as English, German, Hungarian, Arabic, and/or Chinese. The characters may be encoded into a bit-level (ones and zeroes) or other representation, with combinations of multiple bits or other symbols representing characters, and may be compressed. Compression may reduce the number of bits or other symbols needed to represent the information and/or data.

The information and/or data may be compressed by, for example, including references to words and/or transformations. Rather than representing each character individually with a combination of bits or other symbols, some sequences of characters may be represented by references to words, or sequences of characters stored in a corpus or dictionary, and/or transformations, which may be modifications of or changes to the words. The words may be stored sequences of multiple characters, such as at least two characters, at least three characters, at least four characters, or any minimum number of characters. The minimum number of characters should be low enough to include a large number of words to facilitate encoding, but high enough that encoding by a length/distance pair requires fewer bits or other symbols than simply encoding each character individually.

The transformations may include, for example, an addition of a space (" ") before or after the word, capitalization of a first character of the word, addition of and/or prepending a prefix before and/or to the word, addition of and/or appending a period or suffix after and/or to the word, addition of a space and a common word (e.g. "the") after the word, or a change of font (e.g. italicization) of the word. Including suffixes, rather than prefixes (and/or but not prefixes) in the transformations, may facilitate determining whether a transformed word ends with a most recent character. The references to words and/or transformations may reduce the number of bits or other symbols needed to represent the information and/or data. Some sequences of characters may also be represented by references to previous sequences of characters, further reducing the number of bits or other symbols needed to represent the information and/or data.

An example index of transformations is appended hereto as Appendix A. In the example of Appendix A, a first column may include prefixes for which the transformation includes prepending the character(s) (if any) to the retrieved word, a second column includes transformations that include changing the characters in the retrieved word such as changing case or capitalization (such as from lower case to upper case or upper case to lower case) or removing a character, and a third column includes suffixes for which the transformation includes appending the (character(s) if any to the retrieved word. An ID of the transformation, which may range from 0 to 105 in the example shown in Appendix A, may be used to index the transformation. The quotient determined by dividing the distance value by the number of words in the corpus and/or subcorpus may directly index the ID of the transformation, or a remainder determined by dividing the quotient by the number of transformations (e.g. 105+1=106 transformations) may be used to index the ID of the transformation.

The system 100 may include the source 102. The source 102 may include a computing system, or a component of a computing system such as a memory or a file, which stores information or data that represent characters, such as alphanumeric characters, punctuation marks, or characters or symbols according to any understood character system and/or language. The source 102 may, in response to an instruction or as part of an operation or function to transmit the information or data, provide the data or characters to an encoder 104.

The encoder 104 may encode the data for transmission to the destination 110 via a communication channel 106. The encoder 104 may compress the data to reduce a number of bits or other symbols that are needed to transmit the data or information over the channel 106. The encoder 104 may, for example, compress the characters by encoding the characters using codewords according to a lossless compression algorithm, such as Huffman encoding, which generates a unique sequence of bits for each possible character in the data stream. The encoder 104 may also compress the data by referencing previous sequences of characters and/or words which were encoded.

Rather than repeat each character in the previously encoded word, the encoder 104 may include a reference to the previously encoded word, such as a distance from the present position in the data stream, and the length of the previously encoded word. Encoder 104 may, for example, include the distance or number of characters back from the present position and/or current character that the previously encoded word was encoded and/or began, and the length of the referenced and/or previously encoded word, or number of characters in the referenced and/or previously encoded word. The encoder 104 may maintain a window of previously encoded characters and/or words. The encoder 104 may encode sequences of characters by reference to previously encoded sequences of characters within the window of previously encoded characters and/or words.

The encoder 104 may also encode sequences of characters by a reference to a word within a dictionary or corpus of words, and/or a reference to a transformation of the word. In an example implementation, the encoder 104 may distinguish between repeating a previously encoded sequence of characters and referencing a word in the dictionary or corpus of words by the distance value. A distance value that is within a size of the window of previously encoded characters and/or words may indicate that the encoder 104 has encoded the word by repeating a previously encoded sequence of characters. A distance value that exceeds the window size may indicate that the encoder 104 had encoded the sequence of characters by reference to the corpus of words or dictionary and/or the transformation. The sequence of characters may be encoded and/or compressed. In encoded and/or compressed form, the sequence of characters may be represented by a first number and/or second number. The first number and/or second number may represent the length value and/or the distance value.

The encoder 104 may send the encoded data to a decoder 108 via the communication channel 106. While not shown in FIG. 1, the system 100 may also include a transmitter, which may include a modulator for modulating and/or generating the signals for transmission of the data from the encoder 104 over the channel 106, and a receiver, which may include a demodulator for demodulating and/or interpreting the signals received via the channel 106 and providing the encoded data to the decoder 108.

The system 100 may also include the decoder 108. The decoder 108 may decode the data according to an algorithm stored, understood, and/or agreed to by both the encoder 104 and the decoder 108, and/or according to an algorithm designed to decode data encoded according to the algorithm implemented by the encoder 104. The decoder 108 may, for example, decode codewords that represent individual characters, decode sequences of characters based on references to previously decoded characters, and/or may decode sequences of characters based on references to words in the corpus of words and/or references to transformations. The decoder 108 may have maintained a same codebook or encoding table to decode the codewords as the encoder 104 before receiving the encoded data, or may generate the codebook or encoding table based on information received from the encoder 104, such as a map of characters to codewords or a frequency table used to generate the codebook or encoding table. The decoder 108 may have also maintained a same or matching corpus of words and/or index(es) of transformation as the encoder 104 before receiving the encoded data, or may generate the corpus of words and/or index(es) of transformation based on information received from the encoder 104.

The decoder 108 may decode some characters as literals and/or codewords representing single characters, and decode some characters as members of previously decoded sequences, members of words, and/or members of transformed words. The encoded data may include an indicator, such as a specific sequence of bits or other symbols, indicating that subsequent bits or other symbols will refer to a previously encoded sequence of characters, a word, and/or a transformed word. The decoder 108 may, for example, divide a received number, which may represent a distance value, by a number of words in a corpus of words and/or subcorpus included in the corpus of words, to determine a quotient and a reminder. The decoder may retrieve a word from the corpus and/or subcorpus based on the remainder, and may perform a transformation on the retrieved word based on the quotient. The decoder 108 may decode the received number, and/or a second received number which may be included in a length/distance pair, as the transformed word.

The decoder 108 may, for example, determine whether a received distance value exceeds a window size of a window of previously decoded characters. If the distance value does not exceed the window size, then the decoder 108 may repeat a string and/or sequence of previously decoded characters from the window of previously decoded characters with a length based on a received length value at a position in the window of previously decoded characters based on the distance value. If the distance value does exceed the window size, then the decoder 108 may retrieve a word from a corpus of words. The decoder 108 may use the distance value as an index to select a word from the corpus of words.

If a group, series, or sequence of bits or other symbols refers to a previously encoded/decoded word, the group, series, or sequence of bits or other symbols may include a length value and a distance value. The length value and distance value may be included in a length/distance pair.

The decoder 108 may check, for example, whether the distance value included in the encoded data exceeds a window size. If the distance value does not exceed the window size, then the decoder 108 may use the distance value and the length value to repeat a previously decoded string of characters. If the distance value does exceed the window size, then the decoder 108 may use the length value to select a subcorpus within the corpus of words, and/or to select a transformation index. The decoder 108 may, for example, use the distance value to select a word, and/or a transformation, from the corpus or subcorpus of words and/or the selected transformation index. In an example implementation, the decoder 108 may divide the distance value by the number of words in the corpus or subcorpus. The decoder 108 may use the quotient to select a transformation from the index of transformations, and may use the remainder to select a word from the corpus or subcorpus of words. The decoder 108 may perform the selected transformation on the selected word. The decoder 108 may provide the decompressed and/or decoded version of the characters and/or data, which may include representations of characters including individual characters, repeated sequences of characters, and/or transformed words, to the destination 110, which may be a computing device such as a memory device and/or file included in a computing system that may also include the decoder 108.

Figure 2:
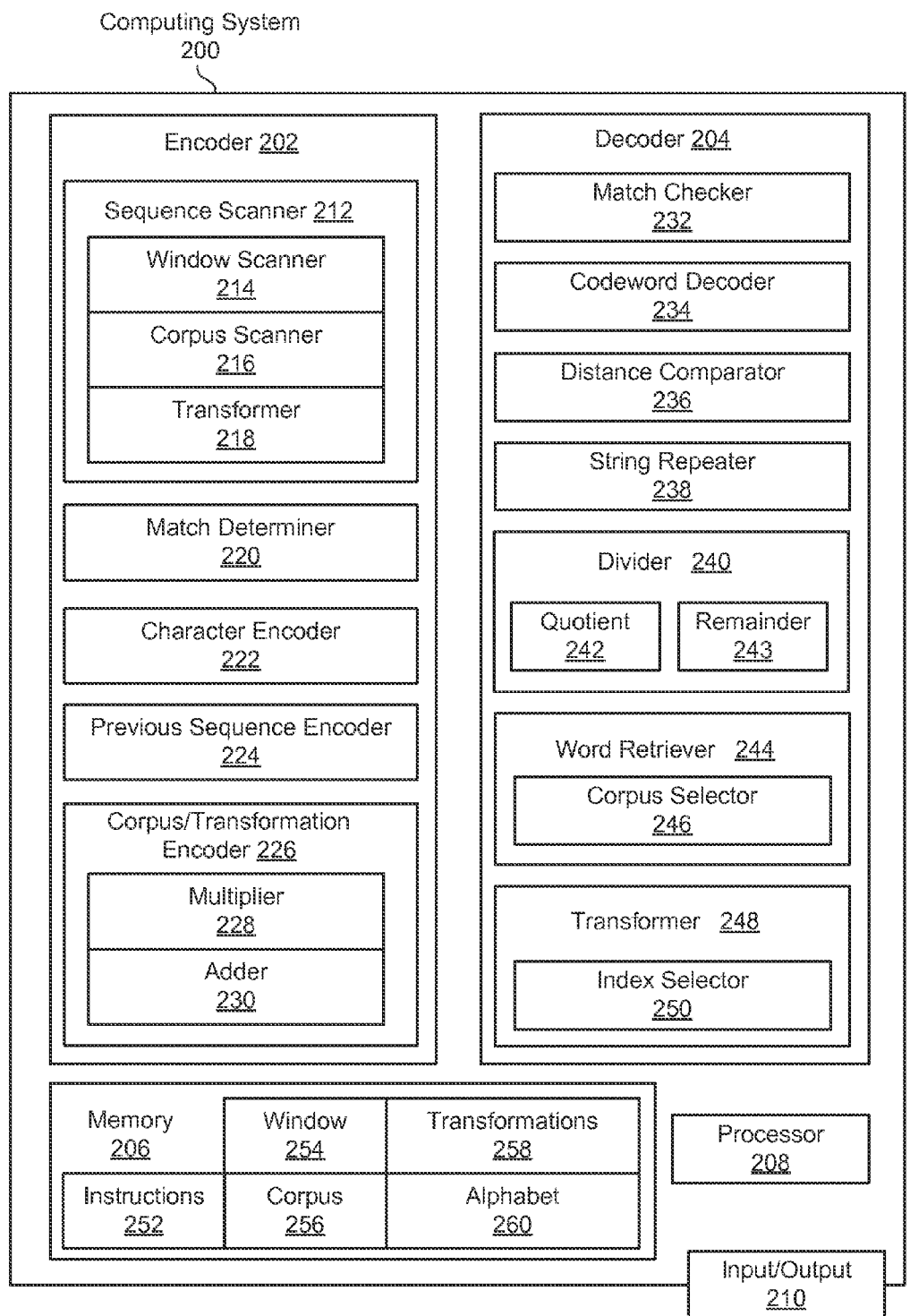
FIG. 2 is a diagram of a computing system according to an example implementation.

FIG. 2 is a diagram of a computing system 200 according to an example implementation. The computing system 200 may include features of the encoder 104 and/or decoder 108. The computing system 200 may be designed, for example, to only compress data, to only decompress data, or to both compress and decompress data according to a same and/or reciprocal compression/decompression algorithm. The functions, modules, and/or devices described with respect to the computing system 200 may be performed by and/or included in a single computing device, or may be divided and/or distributed between multiple computing devices. The computing system 200 may include an encoder 202 which performs any combination of the functions of the encoder 104, a decoder 204, which performs any combination of the functions of the decoder 108, at least one memory device 206, which may store instructions and/or data accessible by the encoder 202 and/or decoder 204, a processor 208, and/or an input/output module 210.

The encoder 202 may encode and/or compress data according to any combination of the functions and techniques described herein. The encoder 202 may include a sequence scanner 212. The sequence scanner 212 may scan sequences of characters and pass the sequences of characters to a match determiner 220.

Figure 3A:
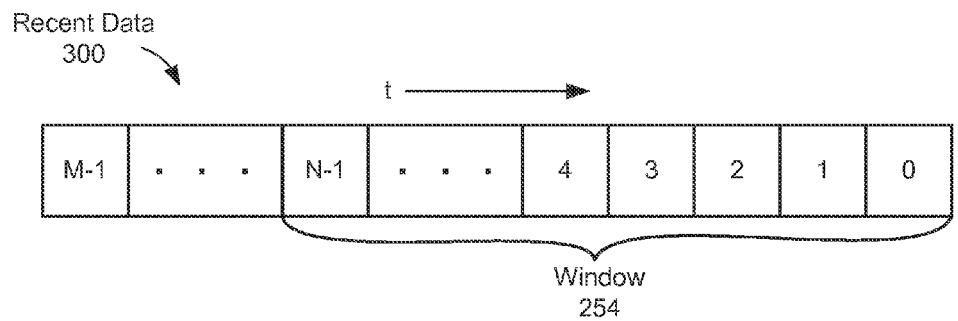
FIG. 3A is a diagram showing recent data and a window.

The sequence scanner 212 may include a window scanner 214. The window scanner 214 may scan a window of previously encoded characters. The window 254, an example of which is shown in FIG. 3A, may be stored in the at least one memory device 206. The window scanner 214 may, for example, scan the window of previously encoded characters at different positions and with different lengths. The window scanner 214 may, for example, scan the window from a first position for words of increasing length from a minimum length to a maximum length, such as from length two, length three, length four, length five, up to the maximum word length. The window scanner 214 may then scan the window from a second position for words from the minimum length to the maximum length. The window scanner 214 may scan the window from all possible starting or beginning positions in the window and for all allowable lengths, and pass the words resulting from the scans to the match determiner 220

FIG. 3A is a diagram showing recent data 300 and an example window 254. As shown in FIG. 3A, the recent data 300, which may represent characters that have recently been encoded, in the order that they were encoded, may include characters numbered from zero to N−1. The characters may be represented by numbers that increase as time increases from the present to the past, as shown by the 't' and arrow, with zero representing the most recently encoded character.

The window 254 of characters may represent a window size of characters that may be repeated by reference to distance and length. The window 254 may have a size, N. The size of the recent data, M, may represent the number of all characters recently encoded (such as the number of characters within a file that have been encoded), or may represent a number of encoded characters stored in the at least one memory device 206.

The window scanner 214 may scan the window 254 for all possible sequences of characters for all possible starting positions in the window 254 from the minimum word size to the maximum word size, such as from N−1 to N−2, from N−1 to N−3, from N−1 to N−4, up to the maximum word size (the word size would be reflected by the difference between the beginning and end points of the scanned sequence plus one, e.g. ([beginning character] (N−1)−[ending character] (N−2)+1) would have a length of two), from N−2 to N−3, and so forth. The window scanner 214 may pass all of the scanned sequences within the window 254 to the match determiner 220 as candidate previous words and/or candidate previous sequences of characters (and/or previously encoded words, previously encoded strings of characters, or previously encoded sequences of characters) for repeating by reference to length and distance, along with a length value and a distance value for each scanned sequence. The match determiner 220 may determine whether a sequence of characters to be encoded matches a previously encoded sequence of characters in the window 254. If the sequence of characters to be encoded does match a sequence of characters in the window 254, then a previous sequence encoder 224 may encode the sequence of characters by a reference to a length and distance, with the distance referring to the beginning point (e.g. N−1) and the length indicating the number of characters and being used to determine the end point (e.g., end point=beginning point−length+1).

The window scanner 214 may also scan the window 254 to retrieve candidate current words and/or candidate current sequences of characters, which may be encoded by a reference to a candidate previous word and/or candidate previous sequence of characters or by a reference to a word in the corpus or subcorpus and/or a transformation in the transformation index. The window scanner 214 may scan the window 254 for all allowed lengths, such as from two or another minimum length sequentially to the longest allowed length, with the ending character being 0 for each possible present and/or most recent word and/or sequence of characters. For example, the window scanner 214 may scan characters 1 through 0 as a possible two-character candidate current word and/or candidate current sequence of characters, may scan characters 2 through 0 as a possible candidate current three-character word and/or candidate current sequence of characters, may scan characters 3 through 0 as a possible four-character candidate current word and/or candidate current sequence of characters, and so on until reaching either the beginning of the recent data (character M−1) or the beginning of the window 254 (character N−1) or the maximum allowed length of the word. The window scanner 214 may pass the scanned words and/or sequences of characters to the match determiner 220 as candidate current words and/or candidate current sequences of characters for encoding by reference to either candidate previous words and/or candidate previous sequences of characters or by reference to words in the corpus or subcorpus and/or transformation index. The window scanner 214 may also pass the beginning points in association with the candidate current words and/or candidate current sequences to the match determiner 220.

Figure 3B:
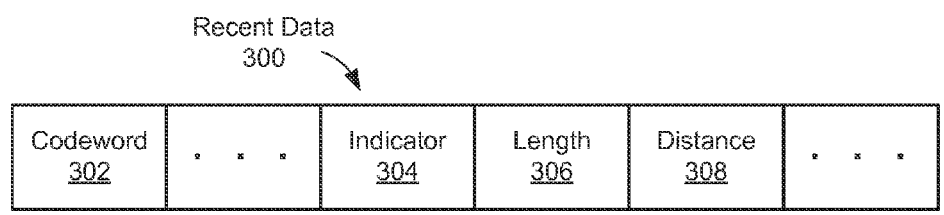
FIG. 3B is a diagram showing encoded data according to an example implementation.

FIG. 3B is a diagram showing encoded data according to an example implementation. In this example, recent data 300 may include data encoded according to an alphabet including at least one codeword 302. The codeword 302 may represent a literal encoding of a single character, and may include a sequence of bits or other symbols which represents a single character according to any encoding system, such as the American Standard Code for Information Interchange (ASCII), Unicode, or a lossless compression algorithm such as Huffman encoding. The codeword 302 may represent a character encoded by mapping characters to codewords according to an alphabet such as the alphabet 260 described with respect to FIG. 6, and which may be decoded by mapping codewords to characters according to the alphabet. The recent data may include more codewords following the codeword 302, representing a sequence of codewords and representing a sequence of encoded characters, as shown by the ellipses between the codeword 302 and an indicator 304.

The recent data 300 may include one or more length/value pairs that either refer to previously encoded sequences of characters, or refer to a word in the corpus and/or a transformation. The recent data 300 may include an indicator 304 preceding the length/distance pair. The indicator 304 may be a unique sequence of bits that indicates that characters will be encoded by a succeeding length/distance pair which may include a length value and distance value. The unique sequence of bits representing the indicator 304 may be determined by the encoding system and/or codebook. The length/distance pair succeeding the indicator 304 may include a length 306, which either indicates a length of the sequence of characters to be repeated or a subcorpus of words and index of transformations, and a distance 308, which indicates either a distance from the present position that the sequence of characters begins or is used to determine the word and transformation.

The recent data 300 may include more blocks and/or codewords as represented by the ellipses after the distance 308, which may include codewords representing individual characters, and/or length/value pairs which may include sequences of indicators, lengths, and/or distances. While the example of FIG. 3B shows the length 306 preceding the distance 308, the length and distance may be encoded in any order. In an example implementation, the indicator 304 need not be encoded separately, and the length and distance may instead be encoded with unique codewords and/or sequences of bits that are distinct from the codewords used to encode single characters.

Returning to FIG. 2, the sequence scanner 212 may include a corpus scanner 216. The corpus scanner 216 may scan a corpus of words as candidate stored words or corpus words to encode the candidate current words and/or candidate current sequences of characters by reference to the candidate stored words or corpus words. The corpus 256 may be stored in the at least one memory device 206.

Figure 4:
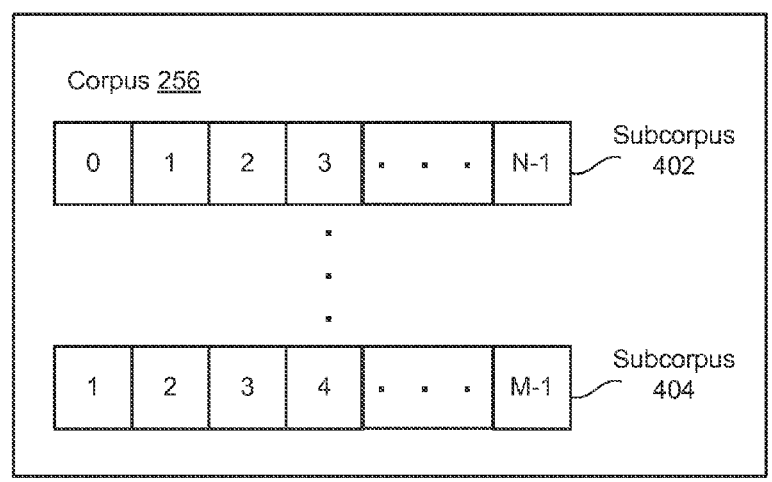
FIG. 4 shows a corpus of words according to an example implementation.

FIG. 4 shows the corpus 256 according to an example implementation. The corpus 256 may include multiple words which may be encoded by references to the words by the length/distance pair. In an example implementation, the corpus 256 may include subcorpuses 402, 404. The subcorpuses 402, 404 may each include multiple words organized into an index and/or array. The words within the subcorpuses 402, 404 and/or corpus 256 may be arranged in any order, such as alphabetically or based on their respective frequencies of occurrence as determined by sampling multiple data samples. The words in the subcorpuses 402, 404 may be indexed from 0 to N−1 or M−1, for example, where N and M are the numbers of words in the respective subcorpuses 402, 404. The number of words, N, M, may be different for different subcorpuses 402, 404, or each subcorpus 402, 404 may have a same number of words, according to example implementations.

The subcorpuses 402, 404 may include words from different languages, such as English, Chinese, German, Arabic, or even words found in technical literature, such as computer science. The corpus 256 may include one subcorpus 402, 404 for each language, or may include multiple subcorpuses for one or more languages to reduce the number of words in some subcorpuses 402, 404 and/or to maintain a similar number of words in each subcorpus 402, 404.

Returning to FIG. 2, the corpus scanner 216 may provide all of the words in the corpus 256 to the transformer 218, or only some of the words which are candidates for including the most recent character (denoted 0 in FIG. 3A). The corpus scanner 216 may, for example, perform a function such as a hash function on the most recent character (denoted by '0' in FIG. 3A) to determine one or more languages and/or subcorpuses 402, 404 (and associated transformation indexes described below) that may include the most recent character, thereby reducing the number of transformations to be performed by the transformer 218 and/or comparisons to be performed by the match determiner 220.

The sequence scanner 212 may include a transformer 218. The transformer 218 may perform transformations on the words received from the corpus scanner 216. The transformer 218 may perform all transformations included in a transformation index on each of the words received from the sequence scanner, or may perform only transformations that may result in words ending with the most recent character. Transformations may include no change to the word, the addition of a space at the end of the word, the addition of a comma at the end of the word, capitalization of a first letter of the word, the addition of an 's' at the end of the word, an addition of a suffix to the end of the word, a change of font (such as italicization), a transformation such as a transformation listed in the appendix to this document, or any other change. The transformations available may be the same for all of the subcorpuses 402, 404, or may be different for each subcorpus 402, 404. The transformations may be different for each subcorpus 402, 404 because different changes to words are made for each language, for example.

Figure 5:
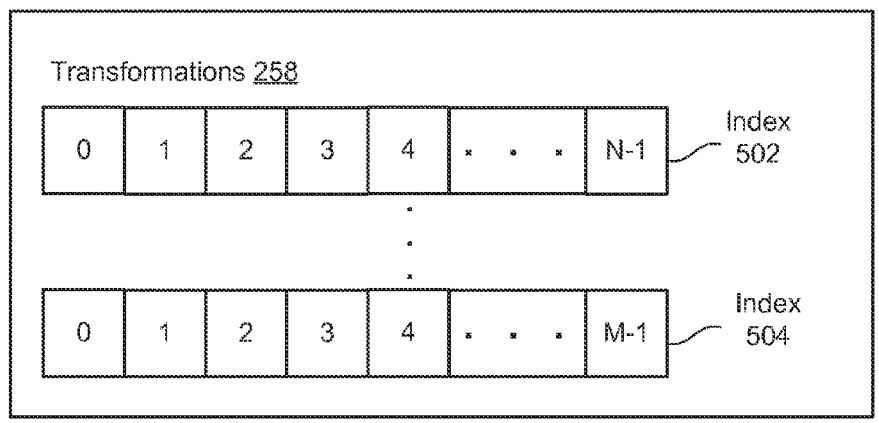
FIG. 5 shows an example of stored transformations.

FIG. 5 shows an example of stored transformations 258. The transformations 258 may be stored in the at least one memory device 206. The stored transformations 258 may include multiple indices 502, 504 which each include transformations. The indices may each include different numbers (e.g., N, M) of transformations, or may each include a same number of transformations. The values of N and M may be different in the examples described with reference to FIGS. 3A, 4, and 5. The values in the index 502, 504 may be used to retrieve a transformation.

The transformer 218 may perform transformations based on all the transformation indexes 502, 504, or only transformation indexes that may include transformations that will result in a word which has a last character matching the most recent character. The transformer 218 may select, for each word to be transformed, a transformation index 502, 504 matching and/or associated with the subcorpus 402, 404 from which the word was retrieved, and/or a transformation index based on the most recent character, such as by performing a function such as a hash function on the most recent character to select the transformation index 502, 504. Performing transformations on the words received from the corpus scanner 216 may result in transformed words. The transformer 218 may provide the transformed words as candidate transformed words to the match determiner 220. The transformer 218 may also provide and/or pass a number or other identifier of the subcorpus 402, 404, a number or other identifier of the transformation index 502, 504 (which may or may not be the same as the number or other identifier of the subcorpus 402, 404), an identifier of the word, and/or an identifier of the transformation, to the match determiner 220 in association with the transformed word.

The encoder 202 may include a match determiner 220. The match determiner 220 may determine whether a candidate current word or candidate current sequence of characters received from the window scanner 214 matches either a candidate previous word and/or candidate previous sequence of characters received from the window scanner 214 or a candidate transformed word received from the transformer 218. The match determiner 220 may determine whether a match exists by comparing each candidate current word or candidate current sequence of characters received from the window scanner to each candidate previous word and/or candidate previous sequence of characters received from the window scanner 214 and each candidate transformed word received from the transformer 218. If the match determiner 220 determines that more than one match exists, then the encoder 202 may encode the longest match and/or match with the most characters, or may select a match based on a cost metric. The cost metric may apply an information entropy model to choose a likely best match. The match determiner 220 may, for example, take into account the distance of the match and/or estimated entropy of the literals and/or characters that are replaced by the match. Some characters that were previously encoded as single characters may be re-encoded as previously encoded words and/or transformed words. If the match determiner 220 determines that a match does not exist, then the encoder may encode the most recent character as a single character.

The encoder 202 may include a character encoder 222. If the match determiner 220 determined that there was no match, then the character encoder 222 may encode the most recent character as a literal, and/or with a single codeword, based on an encoding scheme as described above.

The encoder 202 may also include a previous sequence encoder 224. The previous sequence encoder 224 may encode the sequence of characters if the match determiner 220 determined that the longest matching sequence of characters matched a previously encoded sequence of characters in the window 254. The previous sequence encoder 224 may encode the sequence of characters by the length value and distance value. The previous sequence encoder 224 may include the length value, such as the length 306 shown in FIG. 3B, and the distance value, such as the distance 308 shown in FIG. 3B, of the longest match. The length value and distance value may have been received by the match determiner 220 in association with the candidate current word and/or candidate current sequence of characters.

If the match determiner 220 determined that the longest match was a transformed word, then the encoder 202 may encode the current or most recent sequence of characters a reference to the word in the corpus 256 and/or subcorpus 402, 404, and/or a transformation in the transformations 258 and/or one of the transformation indexes 502, 504. The word may be encoded, for example, by the length/distance pair. The length may indicate which subcorpus 402, 404 the word should be found in and/or from which transformation index 502, 504 should be selected. The word within the subcorpus 402, 404 may be indexed using the distance value. In an example implementation, when decoded, the word within the subcorpus 402, 404 may be indexed by the remainder resulting from dividing the distance value by the number of words in the subcorpus 402, 404, and/or the transformation may be indexed by the quotient resulting from dividing the distance value by the number of words in the subcorpus 402, 404.

The encoder 202 may include a corpus/transformation encoder 226. The corpus/transformation encoder 226 may encode sequences of words when the match determiner 220 has determined that the longest match is a transformed word, and/or the current or most recent sequence of characters matches a word included in the corpus 256, and/or subcorpus 402, 404, or is one transformation away from a word included in the corpus 256 and or subcorpus 402, 404.

The corpus/transformation encoder 226 may include a multiplier 228 and an adder 230. The multiplier 228 may multiply the number of words in the subcorpus 402, 404 from which the word is retrieved by an index number of the transformation performed on the word to achieve the match; the index number of the transformation may have been provided by the transformer 218 in association with the candidate transformed word which had the longest match. The adder 230 may add an index number of the word to the product determined by the multiplier 228; the index number may have been provided by the corpus scanner 216 and/or transformer in association with the candidate transformed word which had the longest match. The sum of the value determined by the adder 230 and the multiplier 228 may be used to provide the distance value in the length/distance pair, such as a distance 308. The length value in the length/distance pair may indicate the subcorpus 402, 404 and/or transformation index 502, 504 which stores the word and/or transformation of the transformed word with the longest match.

The computer system 200 may include a decoder 204. The decoder 204 may decode and/or decompress data received by the computing system 200 according to any combination of the functions and techniques described herein. The decoder 204 may decode and/or decompress data received by the computing system 200 that was decoded and/or decompressed according to an algorithm similar to that described herein with respect to the encoder 202. The decoder 204 may receive codewords representing individual characters in accordance with the alphabet 260 described with respect to FIG. 6. The decoder 204 may also receive a first value and/or a second value, which may be included in a length/distance pair in which the first value represents a length value and/or the second value represents a distance value, respectively, or the first value may represent a distance value and/or the second value may represent a length value.

The decoder 204 may include a match checker 232. The match checker 232 may determine whether data has been encoded based on a match to either previous data within the window 254 or a word in the corpus 256 and/or a transformation, or was encoded as a literal and/or by representing a single character with a codeword. The match checker 232 may determine whether the data was encoded based on a match by checking for an indicator 304, or based on codewords or other representations of a length and/or distance value that indicate encoding based on a match.

If the match checker 232 determines that there is no match to either a previously encoded data or to words and/or transformations, the decoder 204 may decode the data as literals and/or decode a single, most recent codeword or other representation as a single character. If the match checker 232 determines that the data has been encoded by a reference to previously encoded window of data, then the decoder 204 may decode the data by repeating a previously decoded string of characters. If the match checker 232 determines that the data has been encoded by a reference to a word in the corpus 256 and/or a transformation, then the data may be decoded by retrieving the word and/or transformation, and if a transformation is retrieved, performing the retrieved transformation on the retrieved word.

The decoder 204 may include a codeword decoder 234. The codeword decoder 234 may decode the data and/or most recent codeword or other representation as a literal, and/or as a single character. The codeword decoder 234 may decode the data according to an encoding/decoding scheme, such as ASCII, Unicode, or a compression algorithm, such as Huffman encoding, which was mutually understood and/or agreed upon by the decoder 108 (which may include the decoder 204) and encoder 104 (which may include an encoder similar to the encoder 202).

The decoder 204 may include a distance comparator 236. The distance comparator 236 may compare the distance value to the window size. If the distance value is less than or equal to the window size, then the decoder 204 may decode the data by repeating a previously decoded sequence of characters. If the distance exceeds the window size, then the decoder 204 may decode the data retrieving the words from the corpus 256, and/or subcorpus 402, 404, and/or performing a transformation stored in the stored transformations 258 and/or one of the transformations indexes 502, 504 on the retrieved word.

The decoder 204 may include a string repeater 238. The string repeater 238 may repeat a previously decoded string or sequence of characters if the distance comparator 236 determined that the length was less than or equal to the window size. The string repeater 238 may repeat the previously decoded string of characters beginning at a point indicated by the distance value and ending at a point determined based on both the distance value and the length value.

The decoder 204 may include a divider 240. If the match checker 232 determined that there was a match, and a distance comparator 236 determined that the received distance exceeded the window size 254, the divider 240 may perform division to determine a word index number and/or a transformation index number. The divider 240 may determine the transformation index number based on a quotient by dividing a received distance value by a number of words in the corpus 256 and/or subcorpus 402, 404 from which the word is included. The divider 240 may determine the word index number based on a remainder by dividing a received distance value by a number of words in the corpus 256 and/or subcorpus 402, 404 from which the word is included. The subcorpus 402, 404 may be determined based on the length value.

The decoder 204 may include a word retriever 244. The word retriever 244 may retrieve a word if the match checker 232 determined a match and the distance comparator 236 determined that the received distance value exceeded the window size. The word retriever 244 may retrieve a word from the corpus 256. The word retriever 244 may include a corpus selector 246. The corpus selector 246 may select a subcorpus 402, 404 from the corpus 256 based on the received length value. The subcorpuses 402, 404 may, for example, each be associated with an integer value, such as 0, 1, 2, 3, 4, etc. The corpus selector 246 may select the subcorpus 402, 404 associated with the value included in the received length value. After the corpus selector 246 has selected the subcorpus 402, 404, the word retriever 244 may retrieve the word from the subcorpus 402, 404. The word retriever 244 may retrieve the word from the subcorpus 402, 404 based on the remainder 243 determined by the divider 240. The word retriever 244 may, for example, use the remainder 243 as an index value to select the word from the subcorpus 402, 404.

The decoder 204 may include a transformer 248. The transformer 248 may select a transformation based on the quotient 242 determined by the divider 240. The transformer 248 may use the quotient 242 as an index to select the transformation from the stored transformations 258 and/or selected index of transformation 502, 504. In an example in which the transformations 258 include different sets, arrays, and/or indexes of transformations for each length value and/or each subcorpus 402, 404, the transformer 248 may include an index selector 250. The index selector 250 may select a transformation index 502, 504 from which the transformation matrix will be selected. The index selector 250 may select a transformation index 502, 504 based on the received length value and/or based on the subcorpus 402, 404. In an example implementation, the transformation index 502, 504 may each be associated with one subcorpus 402, 404.

The transformer 248 may select a transformation from the stored transformations 258 and/or selected transformation index 502, 504. The transformer 248 may use the quotient 242 as an index into the selected transformation index 502, 504 to select a transformation. The transformer 248 may perform the selected transformation on the retrieved word. After the transformer 248 has performed the transformation on the retrieved word, the decoder 204 may add the transformed word to an output stream of decoded characters.

The at least one memory device 206 may include a non-transitory computer-readable storage medium. The memory device 206 may include a single memory device, or may include multiple memory devices. The memory device(s) 206 may include instructions 252 stored thereon. Instructions 252 may include instructions that may be executed by the processor 208 to cause the computing system 200 to perform any combination of the methods and/or functions described herein.

The memory 206 may store the window 254. The window 254 may include previously encoded characters or previously decoded characters, which may be referenced by the string repeater 238 and/or referenced by the previous sequence encoder 224. The size and/or length of the window 254 may be based on available memory or cache, or may be shortened to be less than a window length that would be possible using available memory or cache to facilitate more instances of encoding characters as transformed words.

The memory 206 may store the corpus 256. The corpus 256 may include words that may be retrieved by the corpus scanner 216 and/or word retriever 244. The corpus 256 may be subdivided into subcorpuses 402, 404.

The memory device 206 may store the transformations 258. The transformations 258 may include transformations that may be retrieved and performed by the transformer 218 and/or transformer 248. The transformations 258 may include a number of transformation indexes 502, 504 based on, and/or equal to, the number of subcorpuses 402, 404.

The memory 206 may also include an alphabet 260. The alphabet 260 may include encodings for characters that may be received in encoded form. The alphabet 260 may include, for example, a fixed-length encoding scheme, such as ASCII or Unicode, or may include encodings according to compression methods such as Huffman encoding. The alphabet 260 may have been stored by the computer system 200 before receiving data, or may have been generated based on information associated with the encoded data either before or after the encoding. The alphabet 260 may, for example, have been previously stored by both the encoder 202 and decoder 204 before any encoding or decoding, or may be generated based on the data to be decoded.

If the alphabet 260 was generated based on the data to be encoded, the encoder 104 may send the alphabet 260 to the decoder 108 in association with the encoded data. The alphabet 260 may have been literally included with the data received, such as by including the characters and associated representations in a header file, or the decoder 108 may generate the alphabet 260 based on information received from the encoder 104 in association with the encoded data, such as a frequency distribution that may be used to construct a Huffman encoding table.

Figure 6:
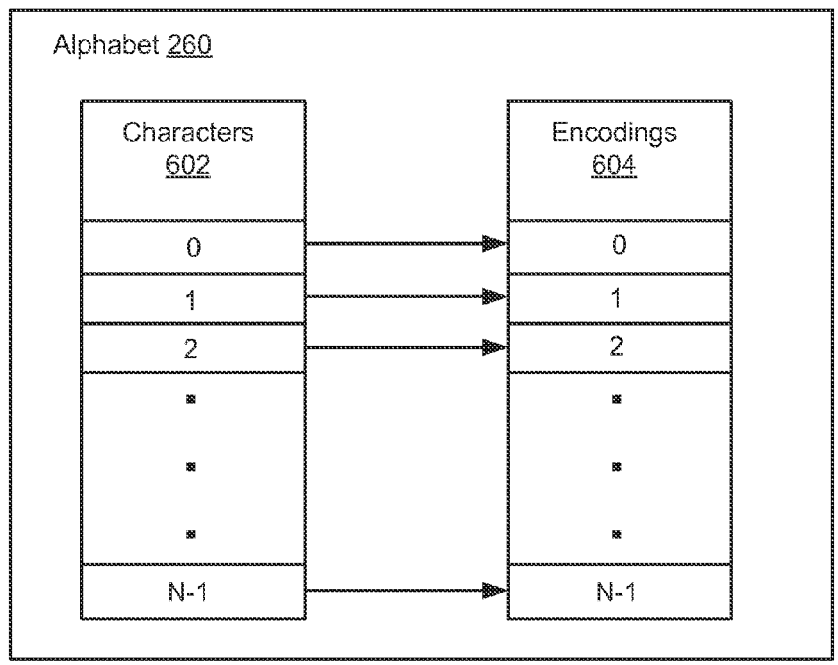
FIG. 6 shows an example of a stored alphabet mapping characters to encodings.

FIG. 6 shows an example of a stored alphabet 260 mapping characters to encodings. As shown in FIG. 6, characters 602 may map to encodings 604 in a one-to-one correspondence. The characters 602 may include alphanumeric characters and punctuation marks, which may also be used to represent the length value and the distance value, or the encodings 604 may include distinct representations of length and/or distance values that represent length and/or distance values but do not represent numeric values that are not encoded by reference to previously encoded/decoded words or words and/or transformations stored in the corpus 256 and/or stored transformations 258. In the example in which distinct encodings 604 are used to represent length and distance values, the length and distance values may be represented by a shared set of values mapped to encodings, or the encodings used to represent length values may be distinct from the encodings used to represent distance values.

The computing system 200 may include a processor 208. The processor 208 may include a processor capable of executing instructions, such as the instructions 252 stored in the memory 206, to perform functions, processes, and/or methods such as the functions, processes, and/or methods described herein.

The computing system 200 may also include an input/output module 210. The input/output module 210 may receive input and/or provide output. The input/output module 210 may include a single device that performs both input and output functions, or may include two or more modules that each perform either input functions or output functions. The input/output module 210 may, for example, receive the encoded data, output the decoded data, receive instructions from a user, and/or provide the decoded data to a display for viewing by the user.

Figure 7:
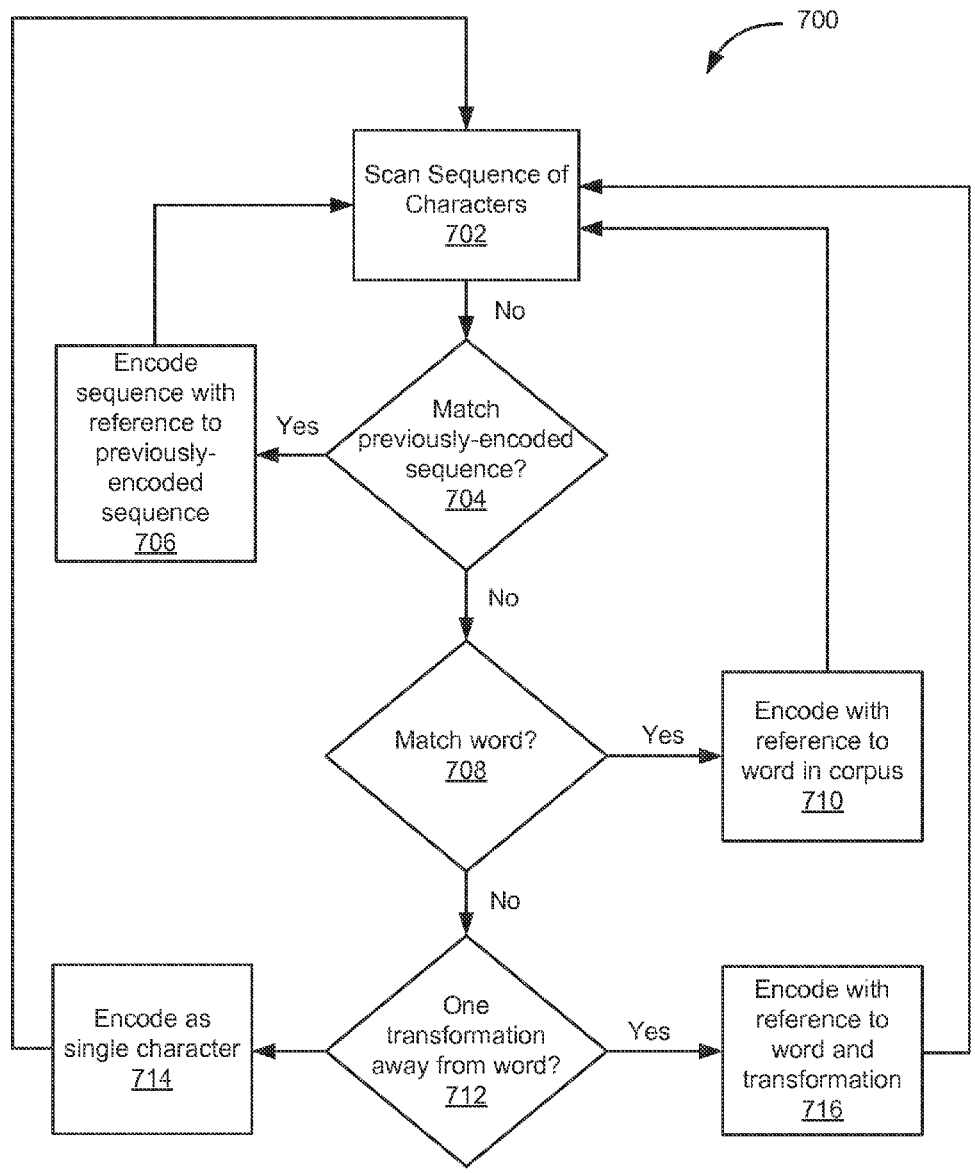
FIG. 7 is a flowchart showing a method for encoding data according to an example implementation.

FIG. 7 is a flowchart showing a method 700 for encoding data according to an example implementation. The method 700 may include the window scanner 214 scanning a sequence of characters for candidate current words and/or candidate current sequences of characters (702), as described above with respect to FIG. 2. The sequence of characters may include characters in the window 254 of characters.

The method 700 may include the match determiner 220 determining whether any of the candidate current words and/or candidate current sequences of characters match a previously encoded sequence (704). The match determiner 220 may determine whether any of the candidate current sequences ending with the most recent character matches any of the previously encoded sequences. If the scanned sequence of characters does match a previously encoded sequence, and/or if the match determiner 220 determines that the match between the scanned sequence of characters is longer than any other match (either with previously encoded characters or a word in the corpus 256), then the method 700 may include the previous sequence encoder 224 encoding the sequence with a reference to a previously encoded sequence (706). The sequence may be encoded with reference to a previously encoded sequence by including a length value indicating a length of the previously encoded sequence, and a distance value indicating a distance from the present position and/or most recent character.

If the scanned sequence of characters does not match a previously encoded sequence, then the method 700 may include the match determiner 220 determining whether the scanned sequence of characters matches a word in the corpus 256 (708). In an example, the match determiner 220 may determine whether the scanned sequence of characters matches a word in the corpus 256 even if the scanned sequence of characters does match a previously encoded sequence. If the scanned sequence of characters does match a word in the corpus 256, and/or if the match determiner 220 determines that the longest match of the scanned sequence of characters is a match to a word in the corpus 256, then the method 700 may include encoding the sequence of characters with a reference to the word in the corpus (710).

The scanned sequence of characters may be encoded with a reference to the word in the corpus by, for example, the length value indicating the subcorpus 402, 404 and the distance value indexing the word in the corpus 256.

If the scanned sequence of characters does not match a word in the corpus 256, then the method 700 may include determining whether the scanned sequence of characters is one transformation away from a word in the corpus 256 (712). In an example, the match determiner 220 may determine whether the scanned sequence of characters is one transformation away from a word in the corpus 256 even if the match determiner 220 determined that the scanned sequence of characters matches a previously encoded sequence and/or that the scanned sequence of characters matches a word in the corpus 256.

If the scanned sequence of characters is one transformation away from a word in the corpus 256, and/or if the match determiner 220 determines that the longest match of the scanned sequence of words is to a transformed word, then the method 700 may include the corpus/transformation encoder 226 encoding the scanned sequence of characters with a reference to the word and the transformation (716). The scanned sequence of characters may be encoded with a reference to the word in the corpus 256 by the length value indicating the subcorpus 402, 404 and the transformation index, and the distance value being used to determine both the word and the transformation. If the scanned sequence of characters is not one transformation away from a word in the corpus, then the method 700 may include encoding the scanned sequence of characters as single characters with individual codewords (714). Encoding the scanned sequence of characters as single characters may include encoding each individual character using a codeword or other encoding representation based on the alphabet 260.

Figure 8:
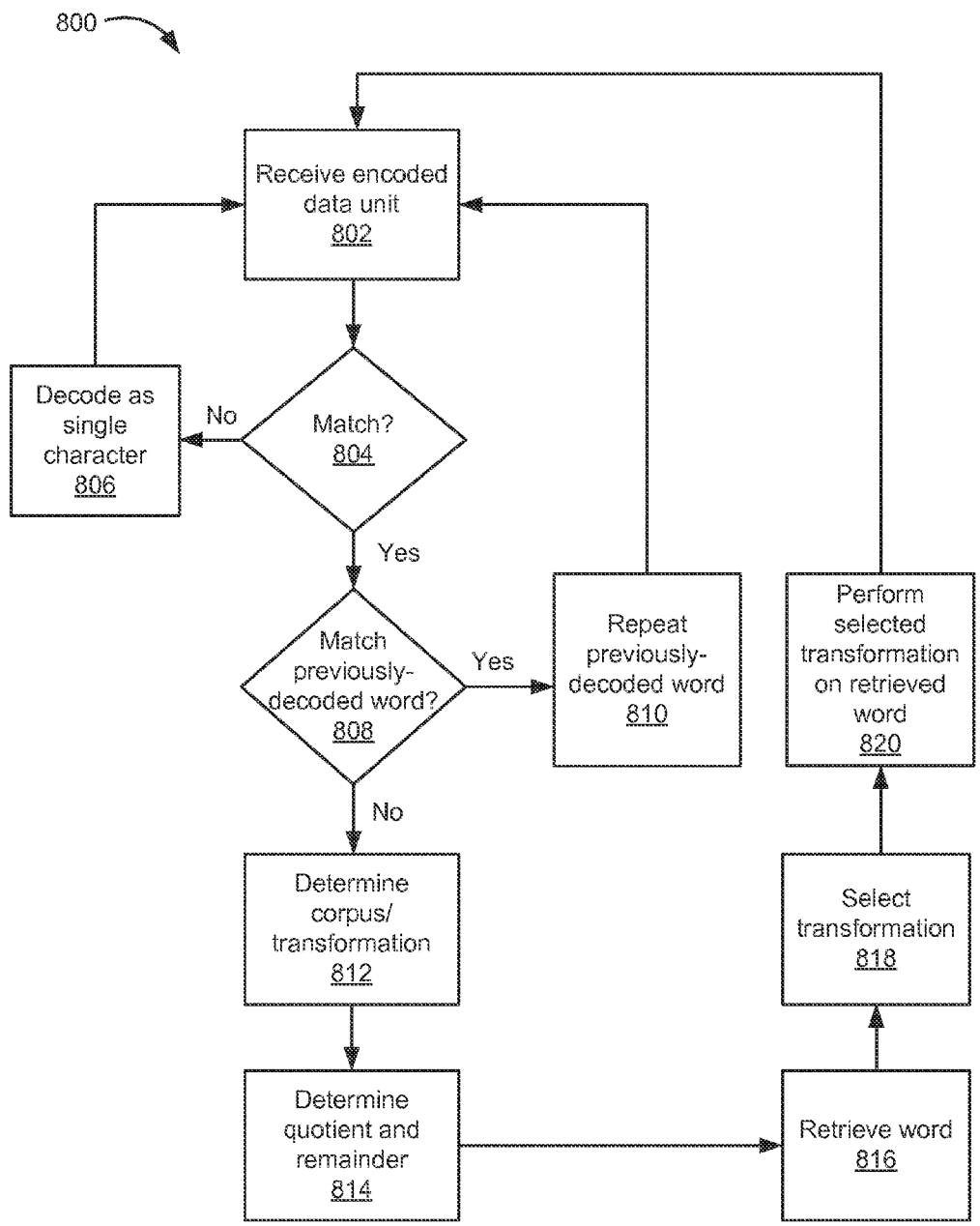
FIG. 8 is a flowchart showing a method for decoding data according to an example implementation.

FIG. 8 is a flowchart showing a method 800 for decoding data according to an example implementation. The method 800 may include the decoder 204 receiving a sequence of encoded characters (802). The encoded characters may be received as part of a file. The method 800 may include the match checker 232 determining whether the encoded character(s) are encoded as a match to previously encoded characters or a match to a stored word and/or transformation (804). If the encoded character(s) is not encoded as a match, then the method 800 may include the decoder 204 decoding the encoded character as a single character (806). The encoded character may be decoded as a literal, translating a codeword into a single character, based on the alphabet 260 stored in the memory 206.

If the encoded character(s) is a match, then the distance comparator 236 may determine whether the encoded characters match a previously decoded word (808). The decoder 204 may determine whether the encoded data unit matches a previously decoded word by the distance comparator 236 comparing a received distance value to the window size. If the distance value is less than or equal to the window size, then the distance comparator 236, and/or decoder 204, may determine that the encoded data unit does match a previously decoded word, and repeat the previously decoded word (810). The string repeater 238 of the decoder 204 may repeat the previously decoded word by repeating the sequence of characters that are the distance value previous from a present or current character, for the number of characters equal to a received length value.

If the distance comparator 236 of the decoder 204 determines that the encoded characters do not match a previously decoded word, then the decoder 204 may determine a corpus and/or a transformation (812). The decoder 204 may determine the corpus and/or a transformation by the corpus selector 246 selecting the corpus 256 and/or subcorpus 402, 404 based on the length value, and/or the index selector 250 may select the transform index 502, 504 based on the length value.

After the word retriever determines the corpus and the transformer 248 determines the transformation, the divider 240 may determine the quotient and remainder of the distance value (814). The divider 240 of the decoder 204 may determine the quotient 242 by dividing the distance value by the number of words in the corpus 256 or subcorpus 402, 404. The divider 240 of the decoder 204 may determine the remainder 243 by performing a modulo operation, dividing the distance value by the number of words in the corpus 256 or subcorpus 402, 404, and determining the remainder 243.

The word retriever 244 of the decoder 204 may then retrieve the word (816). The word retriever 244 may retrieve the word by using the remainder 243 as an index into the corpus 256 or subcorpus 402, 404.

The decoder 204 may then select a transformation (818). The transformer 248 of the decoder 204 may select a transformation by using the quotient 242 as an index into the transformation index 502, 504 and/or transformations 258.

After retrieving the word (816) and selecting the transformation (818), the transformer 248 of the decoder 204 may perform the selected transformation on the retrieved word (820). The decoder 204 may perform the selected transformation on the retrieved word by, for example, adding a space after the word, capitalizing a first letter of the word, adding a character, such as 's' to the end of the word, adding a suffix to the end of the word, omitting an indexed character or number of characters from the word (e.g., "Omit1" may indicate omitting the character indexed by 1 or omitting the first character from the word, "Omit5" may indicate omitting the character indexed by 5 from the word or omitting the first five characters from the word), or changing a font of the word.

Figure 9:
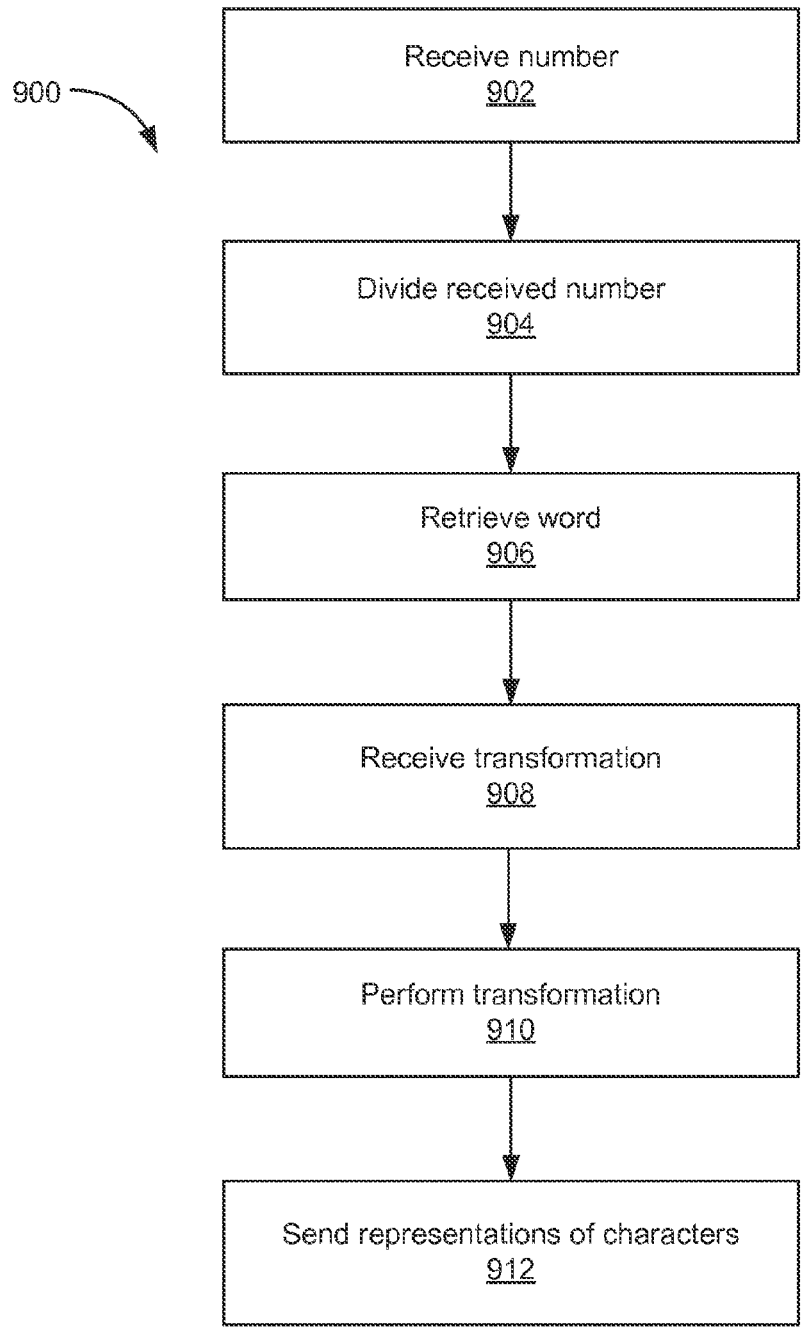
FIG. 9 is a flowchart showing a method according to an example implementation.

FIG. 9 is a flowchart showing a method 900 for decompressing data according to an example implementation. The method 900 may include receiving, via an electronic transmission medium, a compressed sequence of characters, the compressed sequence of characters being represented by at least a first received number (902). The method 900 may also include dividing the first received number by a number of words in a corpus of words to determine a quotient and a remainder (904). The method 900 may also include retrieving a word from the corpus of words based on the remainder, the corpus of words being stored on at least one memory device (906). The method 900 may also include retrieving a transformation from a transformation index based on the quotient, the transformation index being stored on the at least one memory device (908). The method 900 may also include performing the retrieved transformation on the retrieved word (910). The method 900 may also include sending representations of characters included the transformed word to a computing device, the representations of characters included in the transformed word being a decompressed version of the received compressed sequence of characters (912).

According to an example embodiment, retrieving the word from the corpus of words may include indexing the corpus of words as an array using the remainder.

According to an example embodiment, the instructions may be further configured to cause the computing system to receive the number via a communication channel.

According to an example embodiment, the instructions may be further configured to cause the computing system to output the transformed word.

According to an example embodiment, the instructions may be further configured to cause the computing system to output the transformed word within a sequence of characters, the sequence of characters including the transformed word and characters that were individually decoded by mapping codewords to characters.

According to an example embodiment, the instructions may be further configured to cause the computing system to output the transformed word within a sequence of characters, the sequence of characters including the transformed word and words that were generated by referencing words that had previously been decoded.

According to an example embodiment, the instructions may be further configured to cause the computing system to select the corpus of words from at least a first corpus of words including words from a first language and a second corpus of words including words from a second language.

According to an example embodiment, the received number may be a first received number, and the instructions may be further configured to cause the computing system to select a subcorpus from multiple subcorpuses included in the corpus of words based on a second received number.

According to an example embodiment, the received number may be a first received number, and the performing the transformation may include performing the transformation on the retrieved word based on the quotient and a second received number.

Figure 10:
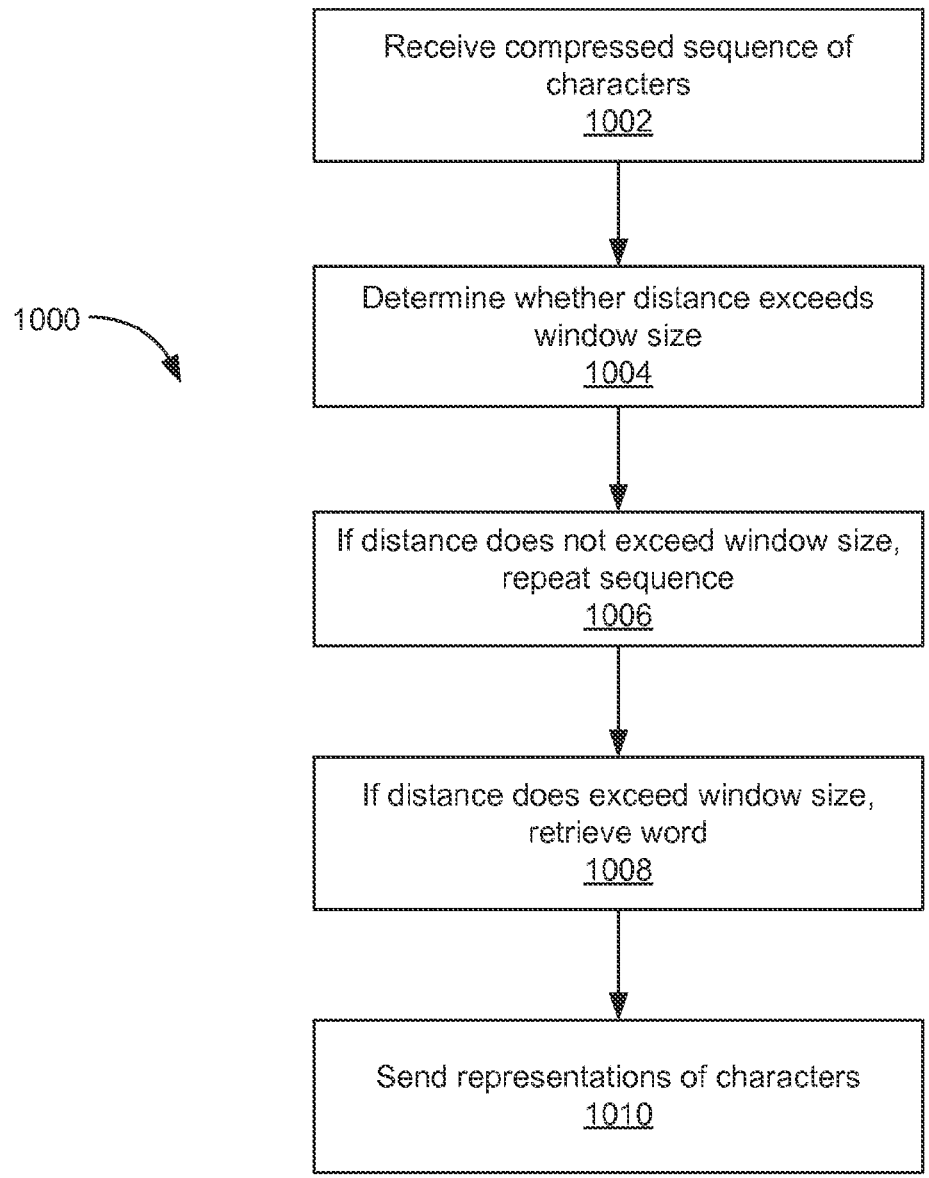
FIG. 10 is a flowchart showing a method according to an example implementation.

FIG. 10 is a flowchart showing a method 1000 for decompressing data according to an example implementation. The method 1000 may include receiving, via an electronic transmission medium, a compressed sequence of characters, the compressed sequence of characters being represented by at least a distance value and a length value (1002). The method 1000 may include determining whether the distance value exceeds a window size of a window of previously decoded characters, the window of previously decoded characters being stored on at least one memory device (1004). The method 1000 may include, if the distance value does not exceed the window size, repeating a sequence of previously decoded characters from the window of previously decoded characters with a length based on the length value at a position in the window of previously decoded characters based on the distance value (1006). The method 1000 may include, if the distance value does exceed the window size, retrieving a word from a corpus of words, the corpus of words being stored on the at least one memory device (1008). The method 1000 may include sending representations of characters included in the retrieved word to a computing device, the representations of characters included in the retrieved word being a decompressed version of the received compressed sequence of characters (1010).

According to an example embodiment, the distance value may be included in a length/distance pair and the length value is included in the length/distance pair.

According to an example embodiment, the retrieving the word from the corpus of words may include retrieving the word from the corpus of words based on the length value and the distance value.

According to an example embodiment, the retrieving the word from the corpus of words may include determining a subcorpus of the corpus of words based on the length value, determining a remainder by dividing the distance value by a number of words in the subcorpus, and indexing the retrieved word within the subcorpus based on the remainder.

According to an example embodiment, the method 1000 may further include performing a transformation on the retrieved word.

According to an example embodiment, the method 1000 may further include performing a transformation on the retrieved word based on the distance value.

According to an example embodiment, the method 1000 may further include performing a transformation on the retrieved word based on the distance value and a number of words in the corpus of words.

According to an example embodiment, the word may be retrieved from a subcorpus included in the corpus of words, the subcorpus being selected based on the length value.

According to an example embodiment, the method 1000 may further include performing a transformation on the retrieved word by selecting a subcorpus of the corpus of words based on the length value, determining a quotient of the distance divided by a number of words in the selected subcorpus, and selecting the transformation based on the quotient.

According to an example embodiment, the method 1000 may further include maintaining a first subcorpus for words in the corpus of words of a first language and a second subcorpus for words in the corpus of words of a second language.

According to an example embodiment, the retrieving the word within the corpus of may include indexing the corpus of words using a remainder based on dividing the distance value by a number of words in the corpus of words.

According to an example embodiment, the method 1000 may further include selecting a subcorpus from the corpus of words based on the length value, selecting an index of transformations from the at least one memory device based on the length value, and performing a transformation on the retrieved word, the transformation being selected from the selected index of transformations.

According to an example embodiment, the retrieved word may be selected based on a remainder determined by dividing the distance value by a number of words in the subcorpus; and the transformation may selected by indexing the selected index of transformations based on a quotient determined by dividing the distance value by the number of words in the subcorpus.

According to an example embodiment, the corpus of words may store the words in an order based on their frequencies.

Figure 11:
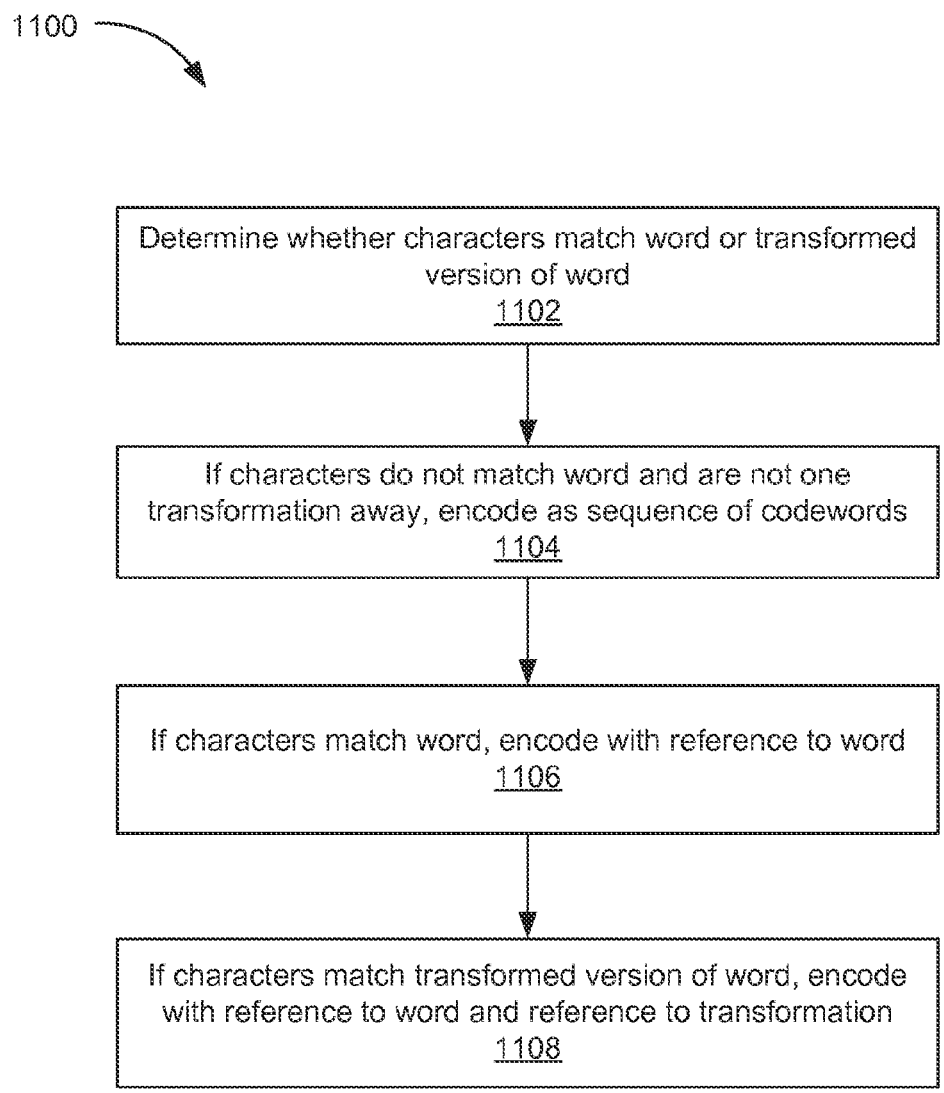
FIG. 11 is a flowchart showing a method according to an example implementation.

FIG. 11 is a flowchart showing a method 1100 for compressing data according to an example implementation. The method 1100 may include determining whether a sequence of characters matches a word included in a corpus of words or matches a transformed version of the word, the corpus of words being stored in at least one memory device and the transformation performed on the word being stored in the at least one memory device (1102). If the sequence if characters does not match the word included in the corpus of words and is not one transformation away from the word, the method 1100 may include encoding the sequence of characters as a sequence of codewords (1104). If the sequence of characters matches the word included in the corpus of words, the method 1100 may include encoding the sequence of characters with a reference to the word (1106). If the sequence of characters matches the transformed version of the word, the method 1100 may include encoding the sequence of characters with a reference to the word and a reference to the transformation (1108).

According to an example embodiment, the method 1100 may further include determining whether the sequence of characters matches a previously encoded sequence of characters, and if the sequence of characters does match the previously encoded sequence of characters, encoding the sequence of characters with a reference to the previously encoded sequence of characters.

According to an example embodiment, the reference to the word and the reference to the transformation may include a number based on multiplying a number of words in a corpus by a number associated with the transformation and adding a number associated with the word.

Figure 12:
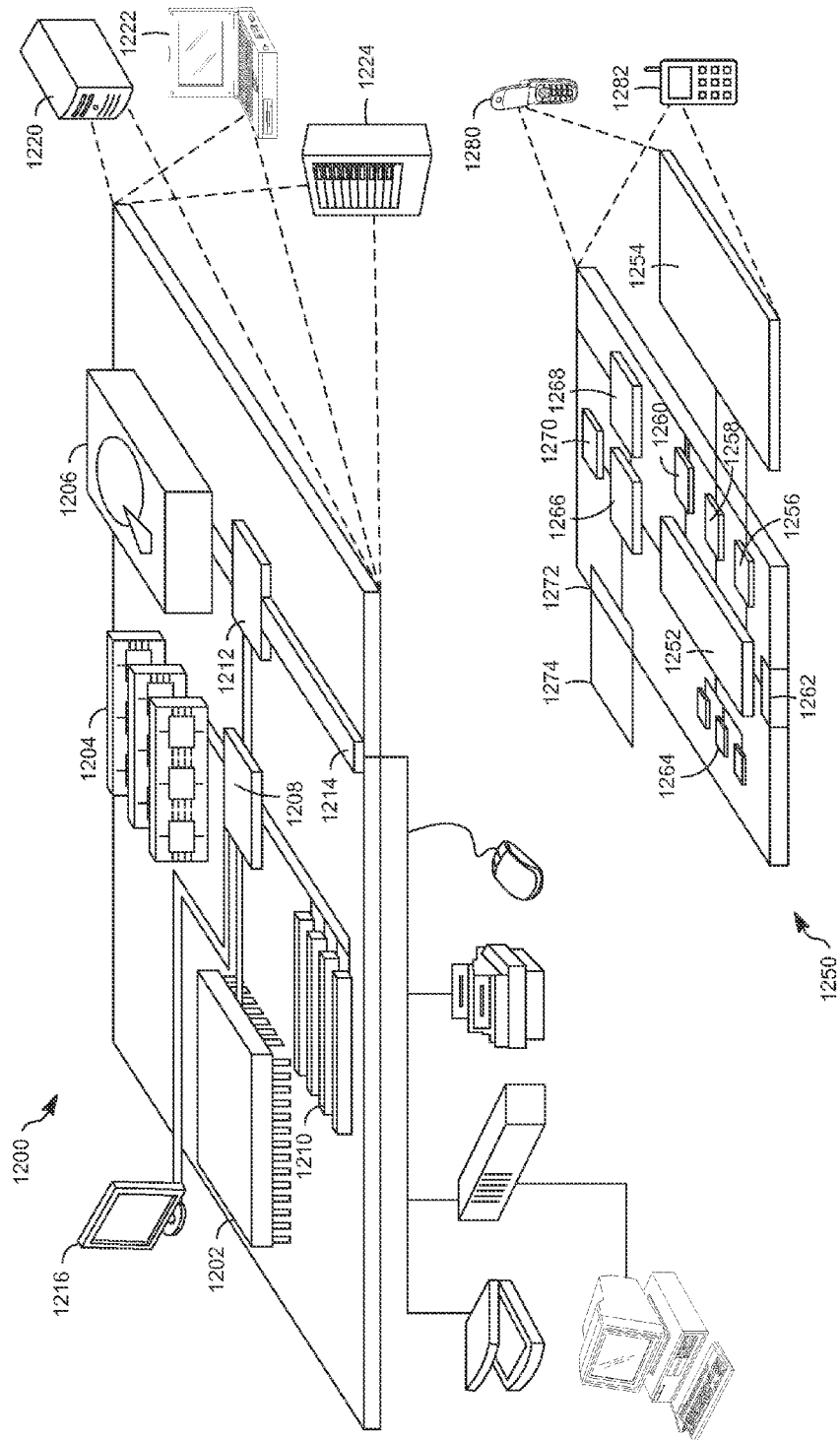
FIG. 12 shows an example of a generic computer device and a generic mobile computer device, which may be used with the techniques described herein.

FIG. 12 shows an example of a generic computer device 1200 and a generic mobile computer device 1250, which may be used with the techniques described herein. Computing device 1200 is intended to represent various forms of digital computers, such as laptops, desktops, workstations, personal digital assistants, servers, blade servers, mainframes, and other appropriate computers. Computing device 1250 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1200 includes a processor 1202, memory 1204, a storage device 1206, a high-speed interface 1208 connecting to memory 1204 and high-speed expansion ports 1210, and a low speed interface 1212 connecting to low speed bus 1214 and storage device 1206. Each of the components 1202, 1204, 1206, 1208, 1210, and 1212, are interconnected using various busses, and may be mounted on a common motherboard or in other manners as appropriate. The processor 1202 can process instructions for execution within the computing device 1200, including instructions stored in the memory 1204 or on the storage device 1206 to display graphical information for a GUI on an external input/output device, such as display 1216 coupled to high speed interface 1208. In other implementations, multiple processors and/or multiple buses may be used, as appropriate, along with multiple memories and types of memory. Also, multiple computing devices 1200 may be connected, with each device providing portions of the necessary operations (e.g., as a server bank, a group of blade servers, or a multi-processor system).

The memory 1204 stores information within the computing device 1200. In one implementation, the memory 1204 is a volatile memory unit or units. In another implementation, the memory 1204 is a non-volatile memory unit or units. The memory 1204 may also be another form of computer-readable medium, such as a magnetic or optical disk.

The storage device 1206 is capable of providing mass storage for the computing device 1200. In one implementation, the storage device 1206 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1204, the storage device 1206, or memory on processor 1202.

The high speed controller 1208 manages bandwidth-intensive operations for the computing device 1200, while the low speed controller 1212 manages lower bandwidth-intensive operations. Such allocation of functions is exemplary only. In one implementation, the high-speed controller 1208 is coupled to memory 1204, display 1216 (e.g., through a graphics processor or accelerator), and to high-speed expansion ports 1210, which may accept various expansion cards (not shown). In the implementation, low-speed controller 1212 is coupled to storage device 1206 and low-speed expansion port 1214. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1200 may be implemented in a number of different forms, as shown in the figure. For example, it may be implemented as a standard server 1220, or multiple times in a group of such servers. It may also be implemented as part of a rack server system 1224. In addition, it may be implemented in a personal computer such as a laptop computer 1222. Alternatively, components from computing device 1200 may be combined with other components in a mobile device (not shown), such as device 1250. Each of such devices may contain one or more of computing device 1200, 1250, and an entire system may be made up of multiple computing devices 1200, 1250 communicating with each other.

Computing device 1250 includes a processor 1252, memory 1264, an input/output device such as a display 1254, a communication interface 1266, and a transceiver 1268, among other components. The device 1250 may also be provided with a storage device, such as a microdrive or other device, to provide additional storage. Each of the components 1250, 1252, 1264, 1254, 1266, and 1268, are interconnected using various buses, and several of the components may be mounted on a common motherboard or in other manners as appropriate.

The processor 1252 can execute instructions within the computing device 1250, including instructions stored in the memory 1264. The processor may be implemented as a chipset of chips that include separate and multiple analog and digital processors. The processor may provide, for example, for coordination of the other components of the device 1250, such as control of user interfaces, applications run by device 1250, and wireless communication by device 1250.

Processor 1252 may communicate with a user through control interface 1258 and display interface 1256 coupled to a display 1254. The display 1254 may be, for example, a TFT LCD (Thin-Film-Transistor Liquid Crystal Display) or an OLED (Organic Light Emitting Diode) display, or other appropriate display technology. The display interface 1256 may comprise appropriate circuitry for driving the display 1254 to present graphical and other information to a user. The control interface 1258 may receive commands from a user and convert them for submission to the processor 1252. In addition, an external interface 1262 may be provide in communication with processor 1252, so as to enable near area communication of device 1250 with other devices. External interface 1262 may provide, for example, for wired communication in some implementations, or for wireless communication in other implementations, and multiple interfaces may also be used.

The memory 1264 stores information within the computing device 1250. The memory 1264 can be implemented as one or more of a computer-readable medium or media, a volatile memory unit or units, or a non-volatile memory unit or units. Expansion memory 1274 may also be provided and connected to device 1250 through expansion interface 1272, which may include, for example, a SIMM (Single In Line Memory Module) card interface. Such expansion memory 1274 may provide extra storage space for device 1250, or may also store applications or other information for device 1250. Specifically, expansion memory 1274 may include instructions to carry out or supplement the processes described above, and may include secure information also. Thus, for example, expansion memory 1274 may be provide as a security module for device 1250, and may be programmed with instructions that permit secure use of device 1250. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1264, expansion memory 1274, or memory on processor 1252, that may be received, for example, over transceiver 1268 or external interface 1262.

Device 1250 may communicate wirelessly through communication interface 1266, which may include digital signal processing circuitry where necessary. Communication interface 1266 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1268. In addition, short-range communication may occur, such as using a Bluetooth, WiFi, or other such transceiver (not shown). In addition, GPS (Global Positioning System) receiver module 1270 may provide additional navigation- and location-related wireless data to device 1250, which may be used as appropriate by applications running on device 1250.

Device 1250 may also communicate audibly using audio codec 1260, which may receive spoken information from a user and convert it to usable digital information. Audio codec 1260 may likewise generate audible sound for a user, such as through a speaker, e.g., in a handset of device 1250. Such sound may include sound from voice telephone calls, may include recorded sound (e.g., voice messages, music files, etc.) and may also include sound generated by applications operating on device 1250.

The computing device 1250 may be implemented in a number of different forms, as shown in the figure. For example, it may be implemented as a cellular telephone 1280. It may also be implemented as part of a smart phone 1282, personal digital assistant, or other similar mobile device.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. A non-transitory computer-readable storage medium comprising instructions stored thereon that, when executed by at least one processor, are configured to cause a computing system to decompress data by:
   receiving, via an electronic transmission medium, a compressed sequence of characters, the compressed sequence of characters being represented by at least a first received number;
   dividing the first received number by a number of words in a corpus of words to determine a quotient and a remainder;
   retrieving a word from the corpus of words based on the remainder, the corpus of words being stored on at least one memory device;
   retrieving a transformation from a transformation index based on the quotient, the transformation index being stored on the at least one memory device;
   performing the retrieved transformation on the retrieved word; and
   sending representations of characters including the transformed word to a computing device, the representations of characters included in the transformed word being a decompressed version of the received compressed sequence of characters.

2. The non-transitory computer-readable storage medium of claim 1, wherein retrieving the word from the corpus of words includes indexing the corpus of words as an array using the remainder.

3. The non-transitory computer-readable storage medium of claim 1, wherein the instructions are further configured to cause the computing system to receive the number via a communication channel.

4. The non-transitory computer-readable storage medium of claim 1, wherein the instructions are further configured to cause the computing system to output the transformed word.

5. The non-transitory computer-readable storage medium of claim 1, wherein the instructions are further configured to cause the computing system to output the transformed word within a sequence of characters, the sequence of characters including the transformed word and characters that were individually decoded by mapping codewords to characters.

6. The non-transitory computer-readable storage medium of claim 1, wherein the instructions are further configured to cause the computing system to output the transformed word within a sequence of characters, the sequence of characters including the transformed word and words that were generated by referencing words that had previously been decoded.

7. The non-transitory computer-readable storage medium of claim 1, wherein the instructions are further configured to cause the computing system to select the corpus of words from at least a first corpus of words including words from a first language and a second corpus of words including words from a second language.

8. The non-transitory computer-readable storage medium of claim 1, wherein:
   the received number is a first received number; and
   the instructions are further configured to cause the computing system to select a subcorpus from multiple subcorpuses included in the corpus of words based on a second received number.

9. The non-transitory computer-readable storage medium of claim 1, wherein:
   the received number is a first received number; and
   the performing the transformation includes performing the transformation on the retrieved word based on the quotient and a second received number.

10. A non-transitory computer-readable storage medium comprising instructions stored thereon that, when executed by at least one processor, are configured to cause a computing system to decompress data by:
    receiving, via an electronic transmission medium, a compressed sequence of characters, the compressed sequence of characters being represented by at least a distance value and a length value;
    determining whether the distance value exceeds a window size of a window of previously decoded characters, the window of previously decoded characters being stored on at least one memory device;
    if the distance value does not exceed the window size, repeating a sequence of previously decoded characters from the window of previously decoded characters with a length based on the length value at a position in the window of previously decoded characters based on the distance value;
    if the distance value does exceed the window size, retrieving a word from a corpus of words, the corpus of words being stored on the at least one memory device; and
    sending representations of characters included in the retrieved word to a computing device, the representations of characters included in the retrieved word being a decompressed version of the received compressed sequence of characters.

11. The non-transitory computer-readable storage medium of claim 10, wherein the distance value is included in a length/distance pair and the length value is included in the length/distance pair.

12. The non-transitory computer-readable storage medium of claim 10, wherein the retrieving the word from the corpus of words includes retrieving the word from the corpus of words based on the length value and the distance value.

13. The non-transitory computer-readable storage medium of claim 10, wherein the retrieving the word from the corpus of words includes:
    determining a subcorpus of the corpus of words based on the length value;
    determining a remainder by dividing the distance value by a number of words in the subcorpus; and
    indexing the retrieved word within the subcorpus based on the remainder.

14. The non-transitory computer-readable storage medium of claim 10, wherein the instructions are further configured to cause the computing system to perform a transformation on the retrieved word.

15. The non-transitory computer-readable storage medium of claim 10, wherein the instructions are further configured to cause the computing system to perform a transformation on the retrieved word based on the distance value.

16. The non-transitory computer-readable storage medium of claim 10, wherein the instructions are further configured to cause the computing system to perform a transformation on the retrieved word based on the distance value and a number of words in the corpus of words.

17. The non-transitory computer-readable storage medium of claim 16, wherein the word is retrieved from a subcorpus included in the corpus of words, the subcorpus being selected based on the length value.

18. The non-transitory computer-readable storage medium of claim 10, wherein the instructions are further configured to cause the computing system to perform a transformation on the retrieved word by:
    selecting a subcorpus of the corpus of words based on the length value;
    determining a quotient of the distance divided by a number of words in the selected subcorpus; and
    selecting the transformation based on the quotient.

19. The non-transitory computer-readable storage medium of claim 10, wherein the instructions are further configured to cause the computing system to maintain a first subcorpus for words in the corpus of words of a first language and a second subcorpus for words in the corpus of words of a second language.

20. The non-transitory computer-readable storage medium of claim 10, wherein the retrieving the word within the corpus of includes indexing the corpus of words using a remainder based on dividing the distance value by a number of words in the corpus of words.

21. The non-transitory computer-readable storage medium of claim 10, wherein the instructions are further configured to cause the computing system to:
    select a subcorpus from the corpus of words based on the length value;
    select an index of transformations from the at least one memory device based on the length value; and
    perform a transformation on the retrieved word, the transformation being selected from the selected index of transformations.

22. The non-transitory computer-readable storage medium of claim 21, wherein:

the retrieved word is selected based on a remainder determined by dividing the distance value by a number of words in the subcorpus; and
the transformation is selected by indexing the selected index of transformations based on a quotient determined by dividing the distance value by the number of words in the subcorpus.

23. The non-transitory computer-readable storage medium of claim 10, wherein the corpus of words stores the words in an order based on their frequencies.

24. A non-transitory computer-readable storage medium comprising instructions stored thereon that, when executed by at least one processor, are configured to cause a computing system to compress data by:
    determining whether a sequence of characters matches a word included in a corpus of words or matches a transformed version of the word, the corpus of words being stored in at least one memory device and the transformation performed on the word being stored in the at least one memory device;
    if the sequence of characters does not match the word included in the corpus of words and is not one transformation away from the word, encoding the sequence of characters as a sequence of codewords;
    if the sequence of characters matches the word included in the corpus of words, encoding the sequence of characters with a reference to the word; and
    if the sequence of characters matches the transformed version of the word, encoding the sequence of characters with a reference to the word and a reference to the transformation;
    the reference to the word and the reference to the transformation including a number based on multiplying a number of words in a corpus by a number associated with the transformation and adding a number associated with the word.

25. The non-transitory computer-readable storage medium of claim 24, wherein the instructions are further configured to cause the computing system to:
    determine whether the sequence of characters matches a previously encoded sequence of characters; and
    if the sequence of characters does match the previously encoded sequence of characters, encode the sequence of characters with a reference to the previously encoded sequence of characters.

* * * * *